(12) United States Patent
Kajiyama et al.

(10) Patent No.: US 8,293,434 B2
(45) Date of Patent: Oct. 23, 2012

(54) METHOD FOR FORMING CONVEX PATTERN, EXPOSURE APPARATUS AND PHOTOMASK

(75) Inventors: Koichi Kajiyama, Yokohama (JP); Michinobu Mizumura, Yokohama (JP); Kazushige Hashimoto, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 0 days.

(21) Appl. No.: 13/160,967

(22) Filed: Jun. 15, 2011

(65) Prior Publication Data

US 2011/0244379 A1    Oct. 6, 2011

Related U.S. Application Data

(63) Continuation of application No. PCT/JP2009/068906, filed on Nov. 5, 2009.

(30) Foreign Application Priority Data

Dec. 16, 2008   (JP) ................................ 2008-319722

(51) Int. Cl.
*G03F 1/68* (2012.01)
*G03C 5/04* (2006.01)
(52) U.S. Cl. ............................... 430/5; 430/311; 355/77
(58) Field of Classification Search .............. 430/5, 322, 430/311, 394; 355/53, 77
See application file for complete search history.

(56) References Cited

U.S. PATENT DOCUMENTS

| | | | |
|---|---|---|---|
| 6,018,422 A * | 1/2000 | Feldman | ........................ 359/619 |
| 2001/0026347 A1 | 10/2001 | Sawasaki et al. | |
| 2003/0048403 A1 | 3/2003 | Satoh | |
| 2003/0090609 A1 | 5/2003 | Inoue et al. | |
| 2008/0304164 A1 * | 12/2008 | Chao et al. | .................... 359/707 |

FOREIGN PATENT DOCUMENTS

JP    56-168654    12/1981
(Continued)

OTHER PUBLICATIONS

International Preliminary Report on Patentability issued in International Application No. PCT/JP2009/068906 on Jun. 30, 2011, along with English translation (14 pages).

(Continued)

*Primary Examiner* — Stephen Rosasco
(74) *Attorney, Agent, or Firm* — Finnegan, Henderson, Farabow, Garrett & Dunner, L.L.P.

(57) ABSTRACT

The present invention is a photomask 3 for exposing a substrate coated with a positive photosensitive material. At least a first mask pattern group 16 and a second mask pattern group 17 are formed on a transparent substrate at a predetermined arrangement pitch. The first mask pattern group 16 has first light shielding patterns 20 arranged at an interval corresponding to two types of convex pattern forming portions of different heights on the substrate, in which the first light shielding patterns 20 each have a substantially same area as a cross sectional area of a convex pattern. The second mask pattern group 17 has a second light shielding pattern 22 and an opening pattern 23, in which the second light shielding pattern 22 has a predetermined area and corresponds to a higher convex pattern forming portion among the two types of convex pattern forming portions, and the opening pattern corresponds to a lower convex pattern forming portion. This enables top parts of a plurality of types of convex patterns of different heights to be shaped substantially hemispherical.

7 Claims, 10 Drawing Sheets

| | FOREIGN PATENT DOCUMENTS | |
|---|---|---|
| JP | 6-148861 | 5/1994 |
| JP | 8-8164 | 1/1996 |
| JP | 2001-201750 | 7/2001 |
| JP | 2003-75808 | 3/2003 |
| JP | 2003-84289 | 3/2003 |
| JP | 2004-110019 | 4/2004 |
| JP | 2004-240136 | 8/2004 |
| JP | 2008-180896 | 8/2008 |

OTHER PUBLICATIONS

International Search Report from Japanese Patent Office of PCT International Application No. PCT/JP2009/068906, mailed Dec. 8, 2009.

* cited by examiner

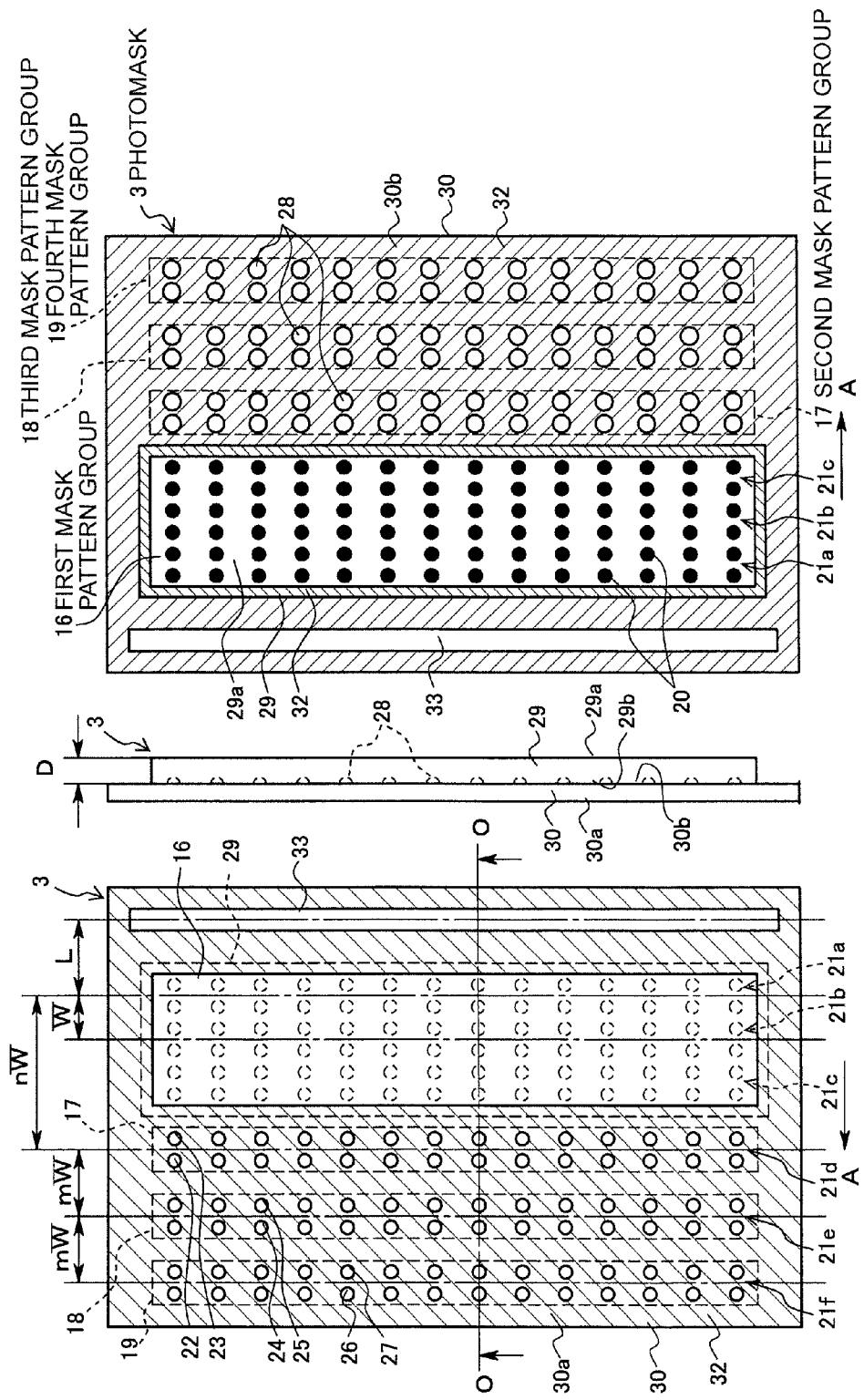

METHOD FOR FORMING CONVEX PATTERN, EXPOSURE APPARATUS AND PHOTOMASK

This application is a continuation of PCT/JP2009/068906, filed on Nov. 5, 2009.

BACKGROUND OF THE INVENTION

1. Field of the Invention

The present invention relates to a method for forming convex patterns in which, while conveying a substrate coated with a positive photosensitive material, the photosensitive material is exposed by controlling an irradiation timing of exposure light with which the substrate is irradiated, thereby forming a plurality of types of convex patterns of different heights on the substrate. In particular, the present invention relates to a method for forming convex pattern so as to enable top of protruding portion to be a substantially hemispherical shape, an exposure apparatus, and a photomask.

2. Description of Related Art

A conventional method for forming convex pattern of this type is used, for example, in forming of columnar spacers on a color filter substrate in a liquid crystal display apparatus. Color filters of RGB are coated with a photosensitive transparent acrylic resin or the like, to be exposed and developed to thereby form columnar spacers. In this case, columnar spacers of different heights are formed by changing film thicknesses of the color filters of RGB (for example, see Japanese Laid-Open (Kokai) Patent Application Publication No. 2003-84289).

SUMMARY OF THE INVENTION

However, in such a conventional method for forming convex pattern, columnar spacers of different heights are formed on the color filters of RGB by changing the film thicknesses of the color filters, and thus, there is a problem that management of the film thicknesses of the color filters of RGB is complicated.

Furthermore, when forming the columnar spacers by exposure, typically the photosensitive material is exposed using a photomask that has mask patterns of a substantially same shape as a cross sectional shape of the columnar spacers, so that a top end surface of each columnar spacer is usually flat. Accordingly, in the case in which top end surfaces of a plurality of high columnar spacers formed on the color filter substrate are not flush with each other, when forming a liquid crystal display substrate by butting the color filter substrate and a TFT substrate together, there is a possibility that a cell gap is restricted by the highest columnar spacer and as a result a predetermined cell gap is not obtained. This may be overcome by increasing a pressure of pressing the color filter substrate against the TFT substrate. However, a very high pressure is needed when, for example, a large-area substrate of 2 m or more is used. This raises a possibility that a significant load is imposed on an apparatus for forming liquid crystal display substrate.

In view of the above-mentioned problems, the present invention has an object to provide a method for forming convex pattern so as to enable top of a plurality of convex portions of different heights to be a substantially hemispherical shape, an exposure apparatus, and a photomask.

In order to achieve the above-mentioned object, the method for forming convex pattern according to the present invention is a method for forming convex pattern in which a substrate coated with a positive photosensitive material is irradiated with exposure light through a photomask to expose the photosensitive material, thereby forming a plurality of types of convex patterns of different heights on the substrate, in the method, while passing the substrate under the photomask in one direction at a constant velocity, at least the following steps are executed: a step in which outer regions of first light shielding portions that are shielded from light by the photomask corresponding to a plurality of types of convex pattern forming portions on the substrate are repeatedly exposed a predetermined number of times; a step in which an outer region of a second light shielding portion that has a predetermined area and is shielded from light by the photomask corresponding to a substantial center of a predetermined convex pattern forming portion among the plurality of types of convex pattern forming portions and a convex pattern forming portion other than the predetermined convex pattern forming portion are exposed to a predetermined depth; and a step in which the photosensitive material on the substrate is developed.

According to this structure, while passing the substrate coated with the positive photosensitive material under the photomask in one direction at a constant velocity, at least the following is performed: outer regions of first light shielding portions that are shielded from light by the photomask corresponding to a plurality of types of convex pattern forming portions of different heights on the substrate are repeatedly exposed a predetermined number of times; an outer region of a second light shielding portion that has a predetermined area and is shielded from light by the photomask corresponding to a substantial center of a predetermined convex pattern forming portion among the plurality of types of convex pattern forming portions and a convex pattern forming portion other than the predetermined convex pattern forming portion are exposed to a predetermined depth; and then the photosensitive material on the substrate is developed. Thus, the plurality of types of convex patterns of different heights are formed on the substrate.

Moreover, the exposure apparatus according to the present invention is an exposure apparatus that, while conveying a substrate coated with a positive photosensitive material in one direction at a constant velocity, exposes the photosensitive material by controlling, by a control device, an irradiation timing of exposure light with which the substrate is irradiated through a photomask, thereby exposing a plurality of types of convex patterns of different heights on the substrate. When the substrate passes under the photomask, the control device controls the irradiation timing of the exposure light at least so that: outer regions of first light shielding portions that are shielded from light by the photomask corresponding to a plurality of types of convex pattern forming portions for the plurality of types of convex patterns on the substrate are repeatedly exposed a predetermined number of times; and an outer region of a second light shielding portion that has a predetermined area and is shielded from light by the photomask corresponding to a substantial center of a predetermined convex pattern forming portion among the plurality of types of convex pattern forming portions and a convex pattern forming portion other than the predetermined convex pattern forming portion are exposed to a predetermined depth.

According to this structure, when the substrate coated with the positive photosensitive material passes under the photomask in one direction at a constant velocity, the control device controls the irradiation timing of the exposure light at least so that: outer regions of first light shielding portions that are shielded from light by the photomask corresponding to a plurality of types of convex pattern forming portions of different heights on the substrate are repeatedly exposed a predetermined number of times; and an outer region of a second light shielding portion that has a predetermined area and is shielded from light by the photomask corresponding to a substantial center of a predetermined convex pattern forming portion among the plurality of types of convex pattern forming portions and a convex pattern forming portion other than the predetermined convex pattern forming portion are exposed to a predetermined depth. Thus, the plurality of types of convex patterns of different heights are exposed on the substrate.

Moreover, the photomask according to the present invention is a photomask used in an exposure apparatus that, while conveying a substrate coated with a positive photosensitive material in one direction at a constant velocity, exposes the photosensitive material by controlling an irradiation timing of exposure light with which the substrate is irradiated, thereby forming a plurality of types of convex patterns of different heights on the substrate. In the photomask, at least a first mask pattern group and a second mask pattern group are arranged on a transparent substrate at a predetermined interval. The first mask pattern group has first light shielding patterns arranged at an interval corresponding to a plurality of types of convex pattern forming portions for the plurality of types of convex patterns on the substrate, each of the first light shielding patterns having a substantially same area as a cross sectional area of a convex pattern, and the second mask pattern group has a second light shielding pattern and an opening pattern arranged at the interval corresponding to the plurality of types of convex pattern forming portions, the second light shielding pattern having a predetermined area and corresponding to a predetermined convex pattern forming portion among the plurality of types of convex pattern forming portions, and the opening pattern corresponding to a convex pattern forming portion other than the predetermined convex pattern forming portion.

According to this structure, while conveying the substrate coated with the positive photosensitive material in one direction at a constant velocity, a plurality of types of convex pattern forming portions of different heights on the substrate are shielded from light by first light shielding patterns of a first mask pattern group to expose outer regions of the plurality of types of convex pattern forming portions. Moreover, a predetermined convex pattern forming portion of the plurality of types of convex pattern forming portions is shielded from light by a second light shielding pattern of a predetermined area of a second mask pattern group to expose an outer region of the predetermined convex pattern forming portion, and a convex pattern forming portion other than the predetermined convex pattern forming portion is exposed by an opening pattern of the second mask pattern group.

Moreover, in the photomask, the first mask pattern group is formed on one surface of the transparent substrate, the second mask pattern group is formed on the other surface of the transparent substrate, and microlenses are formed on the same side as the surface of the transparent substrate at a position retracting by a predetermined distance, from the surface on which the first mask pattern group is formed toward the other surface of the transparent substrate, the microlenses corresponding to the second light shielding pattern and the opening pattern of the second mask pattern group. According to this, the first mask pattern group is formed on one surface of the transparent substrate, the second mask pattern group is formed on the other surface of the transparent substrate, and microlenses are formed on the same side as the surface of the transparent substrate at a position retracting by a predetermined distance, from the surface on which the first mask pattern group is formed toward the other surface of the first transparent substrate, the microlenses corresponding to the second light shielding pattern and the opening pattern of the second mask pattern group. This enables the plurality of types of convex patterns of different heights to be formed on the substrate.

Moreover, in the photomask, the first mask pattern group is formed on one surface of a first transparent substrate, the second mask pattern group is formed on one surface of a second transparent substrate and the microlenses are formed on the other surface of the second transparent substrate, and the other surface of the first transparent substrate and the other surface of the second transparent substrate are butt-joined together. According to this, the first mask pattern group is formed on one surface of a first transparent substrate, the second mask pattern group is formed on one surface of a second transparent substrate and the microlenses are formed on the other surface of the second transparent substrate, and the other surface of the first transparent substrate and the other surface of the second transparent substrate are butt-joined together. Thus, the microlenses are formed on the same side as one surface of the first transparent substrate, at the position retracting by the predetermined distance, from the surface on which the first mask pattern group is formed toward the other surface of the first transparent substrate.

Moreover, in the photomask, the first mask pattern group is formed on one surface of a first transparent substrate, the second mask pattern group is formed on one surface of a second transparent substrate having a smaller thickness than the first transparent substrate and the microlenses are formed on the other surface of the second transparent substrate, and an end surface of the first transparent substrate and an end surface of the second transparent substrate are butt-joined together. According to this, the first mask pattern group is formed on one surface of a first transparent substrate, the second mask pattern group is formed on one surface of a second transparent substrate having a smaller thickness than the first transparent substrate and the microlenses are formed on the other surface of the second transparent substrate, and an end surface of the first transparent substrate and an end surface of the second transparent substrate are butt-joined together. Thus, the microlenses are formed on the same side as one surface of the first transparent substrate, at the position retracting by the predetermined distance, from the surface on which the first mask pattern group is formed toward the other surface of the first transparent substrate.

Moreover, in the photomask, peripheries of the microlenses are shielded from light by a light shielding film. According to this, a light shielding film shields peripheries of the microlenses from light.

The invention according to any of claims 1, 2, and 3 enables top parts of convex patterns to be shaped substantially hemispherical. For example, when used in forming of columnar spacers for regulating a cell gap of a liquid crystal display substrate, since top parts of the columnar spacers are substantially hemispherical, contact between the columnar spacers and a substrate disposed on the columnar spacers is point contact. Even if a plurality of high columnar spacers among a plurality of columnar spacers of different heights vary in height, a substantially hemispherical top part of the highest columnar spacer can be easily crushed with a smaller pressure than in the conventional case. Hence, a uniform cell gap can be formed throughout an entire surface of a large-area liquid crystal display substrate. This contributes to a reduced load on an apparatus for forming a liquid crystal display substrate.

Moreover, the invention according to claim 4 enables irradiation energy of exposure light on the substrate to be enhanced by the microlenses. This contributes to a higher conveying velocity of the substrate, and a shorter tact time of an exposure process.

In addition, the invention according to claim 5 or 6 enables the microlenses to be easily formed on the same side as one surface of the transparent substrate, at the position retracting by the predetermined distance, from the surface on which the first mask pattern group is formed toward the other surface of the transparent substrate. Therefore, the mask patterns in the first mask pattern group can be used for reduction exposure and the mask patterns in the second mask pattern group can be used for reduction exposure by the microlenses, without changing a distance between the photomask and the substrate coated with the photosensitive material.

Furthermore, the invention according to claim 7 enables the photosensitive material to be prevented from being exposed to exposure light leaking from around the microlenses. This enhances convex pattern forming accuracy.

BRIEF DESCRIPTION OF THE DRAWINGS

FIGS. 4A to 4C are views illustrating an example of a structure of a photomask used in the exposure apparatus according to the present invention: FIG. 4A is a plan view, FIG. 4B is a right side view; and FIG. 4C is a bottom view;

FIG. 5A is a main part enlarged sectional view of a first mask pattern group; FIG. 5B is a main part enlarged sectional view of a second mask pattern group; FIG. 5C is a main part enlarged sectional view of a third mask pattern group; and FIG. 5D is a main part enlarged sectional view of a fourth mask pattern group;

FIG. 6A illustrates the first mask pattern group; FIG. 6B illustrates the second mask pattern group; FIG. 6C illustrates the third mask pattern group; and FIG. 6D illustrates the fourth mask pattern group;

DESCRIPTION OF THE PREFERRED EMBODIMENTS

Figure 1:
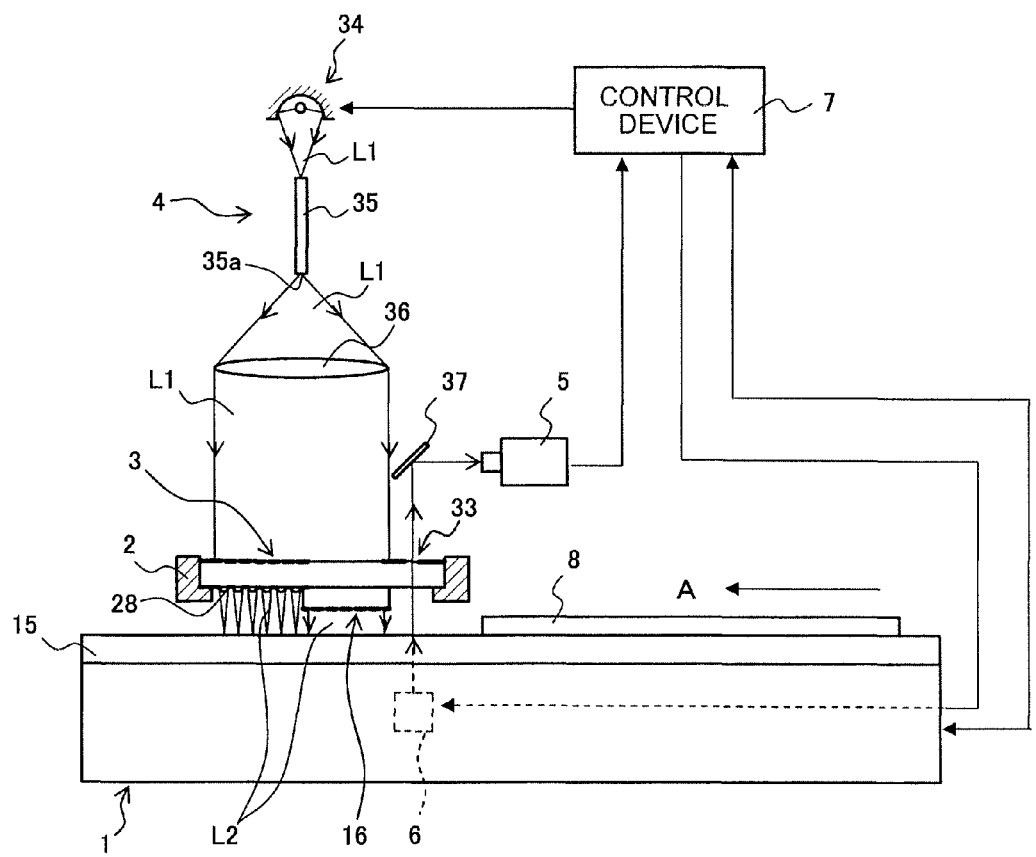
FIG. 1 is a schematic view illustrating an embodiment of an exposure apparatus according to the present invention.

Hereinafter, an embodiment of the present invention will be described in detail with reference to the attached drawings. FIG. 1 is a schematic view illustrating a structure of an embodiment of an exposure apparatus according to the present invention. This exposure apparatus is an apparatus that, while conveying a substrate coated with a positive photosensitive material, exposes the photosensitive material by controlling an irradiation timing of exposure light with which the substrate is irradiated, thereby forming a plurality of types of convex patterns of different heights on the substrate. The exposure apparatus includes a conveying device 1, a mask stage 2, a photomask 3, an exposure optical system 4, an imaging device 5, an illumination device 6, and a control device 7. The following describes the case in which the substrate coated with the positive photosensitive material is a color filter substrate 8.

Figure 2:
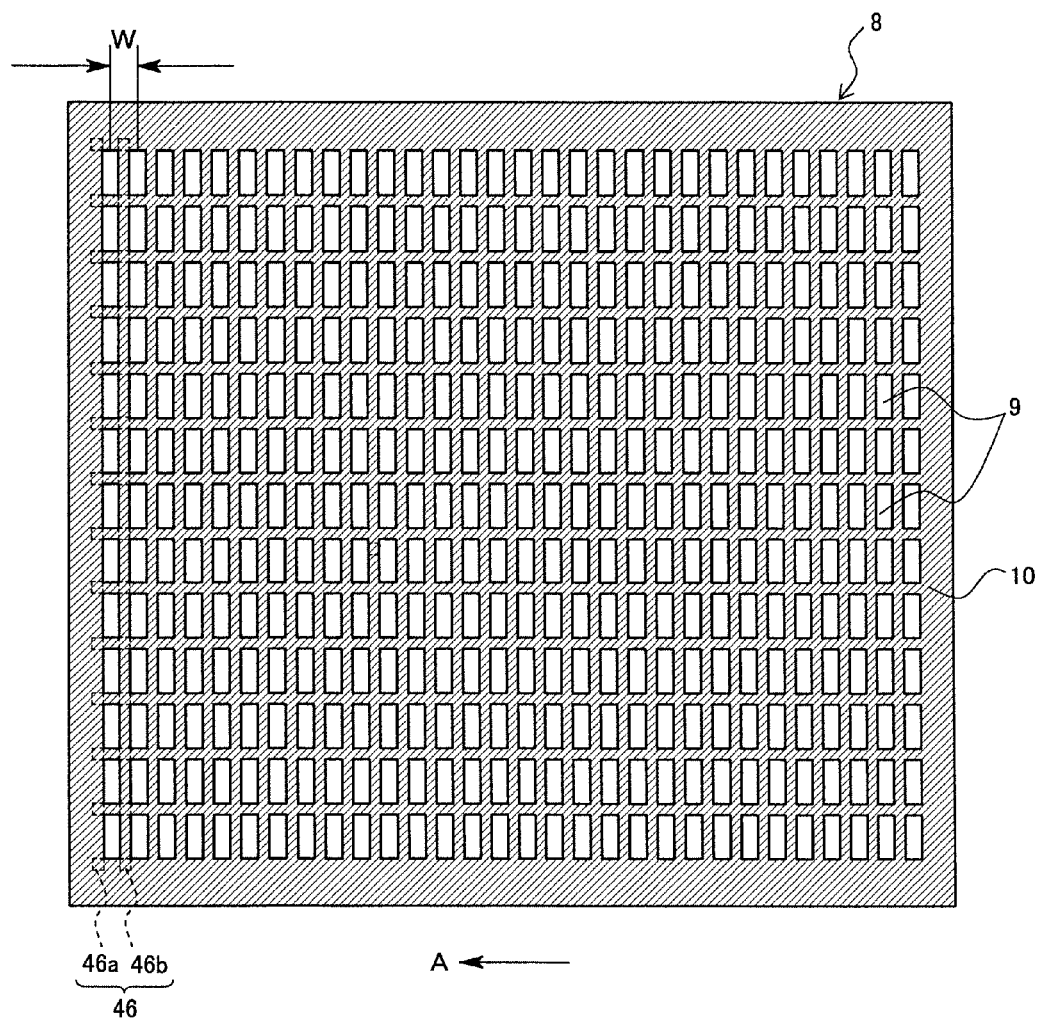
FIG. 2 is a plan view illustrating an example of a structure of a color filter substrate used in the exposure apparatus.
Figure 3:
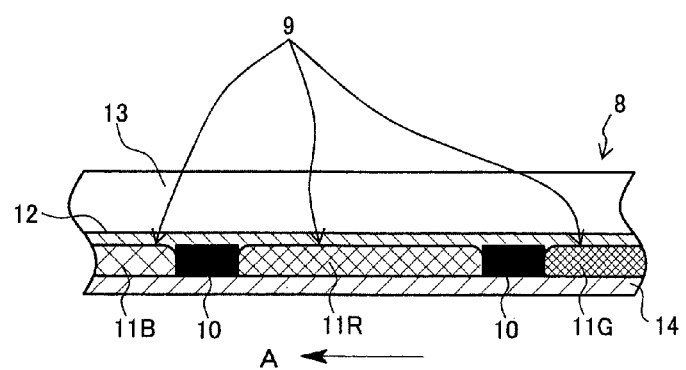
FIG. 3 is a main part enlarged sectional view illustrating a section parallel to a conveying direction of the color filter substrate.

The color filter substrate 8 includes: a black matrix 10 having a of a plurality of pixels 9 in a matrix state on a transparent glass substrate as illustrated in FIG. 2; RGB color filters 11R, 11G, and 11B formed in turn corresponding to the pixels 9 as illustrated in FIG. 3; and a flattening film 12 covering upper surfaces of the black matrix 10 and the color filters 11R, 11G, and 11B. An upper surface of the color filter substrate 8 is coated with a positive photosensitive material 13. At predetermined positions on the black matrix 10, such as positions corresponding to four corners of each pixel 9 (see FIG. 2), columnar spacers as two types of convex patterns of different heights are formed. Note that w denotes an arrangement pitch of the pixels 9 in a conveying direction indicated by arrow A. In FIG. 3, reference numeral 14 is the transparent glass substrate.

The conveying device 1 conveys a stage 15 with the color filter substrate 8 thereon at a predetermined velocity in one direction (direction indicated by arrow A), and for example, moves the stage 15 by a moving mechanism that combines a motor, a gear, and the like. The conveying device 1 also includes a velocity sensor (not illustrated in FIG. 1) for detecting the moving velocity of the stage 15, and a position sensor (not illustrated in FIG. 1) for detecting a moving distance of the stage 15.

The mask stage 2 is provided above the conveying device 1. The mask stage 2 holds the below-mentioned photomask 3 so as to face, in proximity, the color filter substrate 8 mounted and conveyed on the conveying device 1. The mask stage 2 has an opening in its center corresponding to a region that includes a mask pattern forming area and an observation window 33 of the photomask 3 (see, FIG. 4), to thereby hold the photomask 3 by positioning peripheral portions of the photomask 3. The mask stage 2 is movable together with the below-mentioned imaging device 5 in a direction substantially orthogonal to the conveying direction indicated by arrow A of the color filter substrate 8, within a plane parallel to the surface of the stage 15. The mask stage 2 may also be rotatable around the center of the mask stage 2 as an axis within a predetermined angle range, according to need.

Figure 5A:
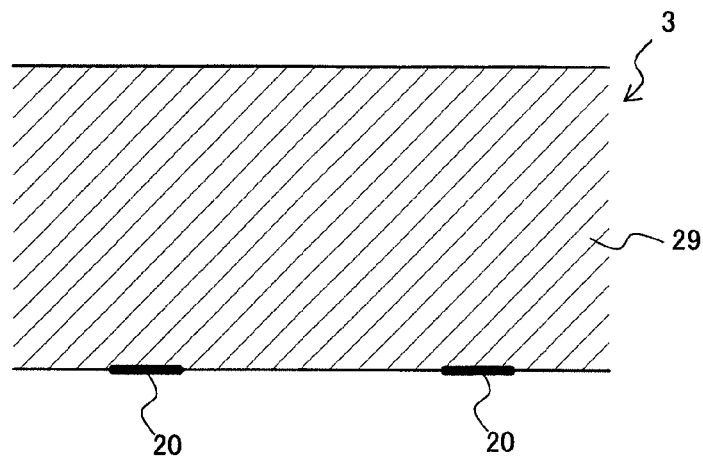
FIGS. 5A to 5D are sectional views taken along line o-o in FIG. 4.
Figure 5B:
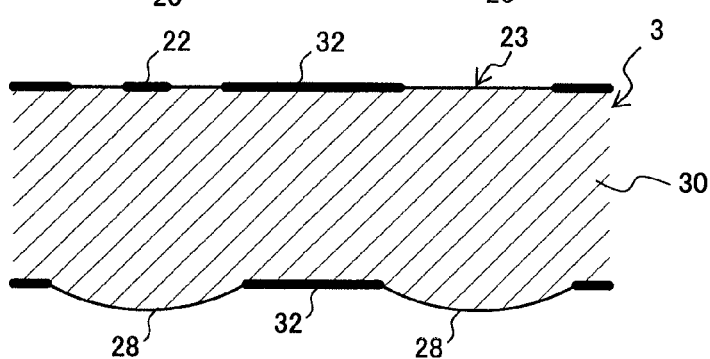
Figure 5C:
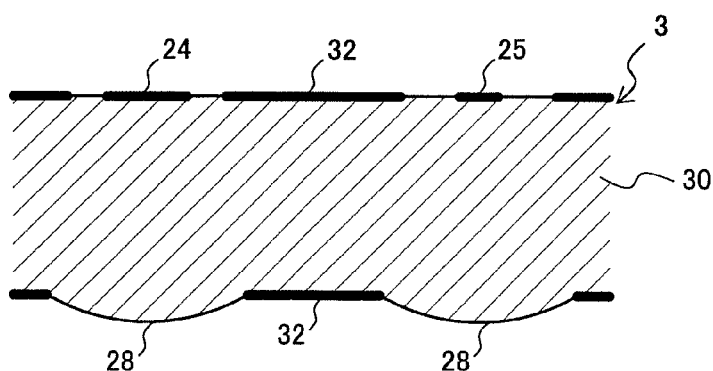
Figure 5D:
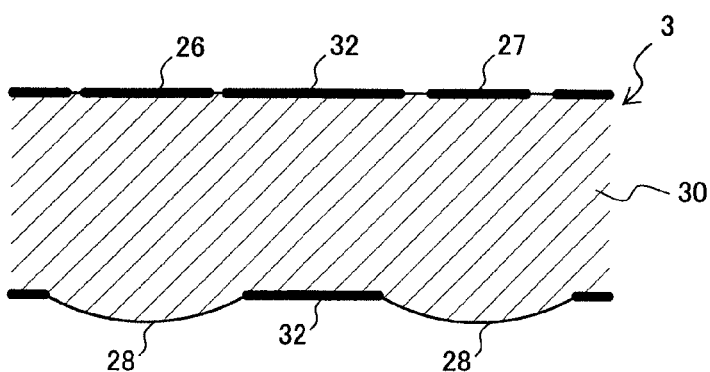
Figure 6A:
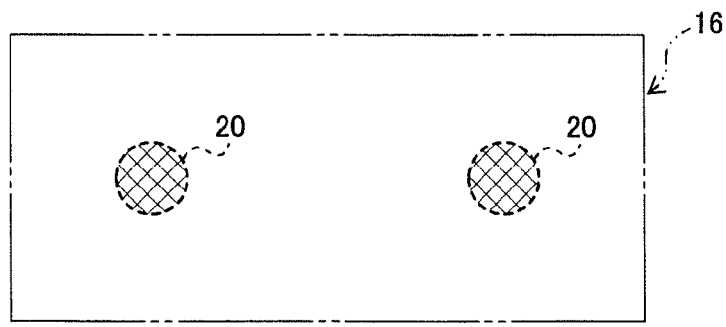
FIGS. 6A to 6D are main part enlarged plan views of the photomask.
Figure 6B:
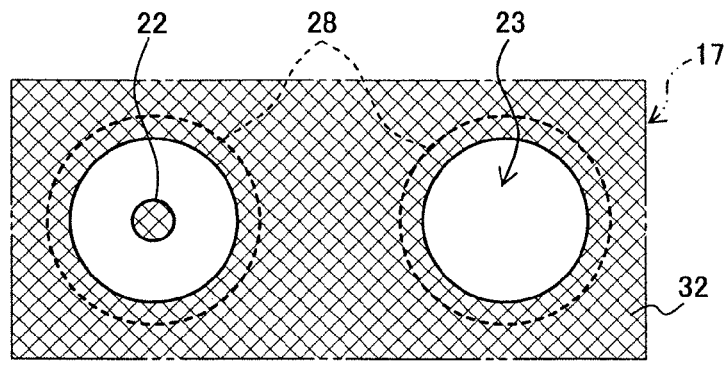
Figure 6C:
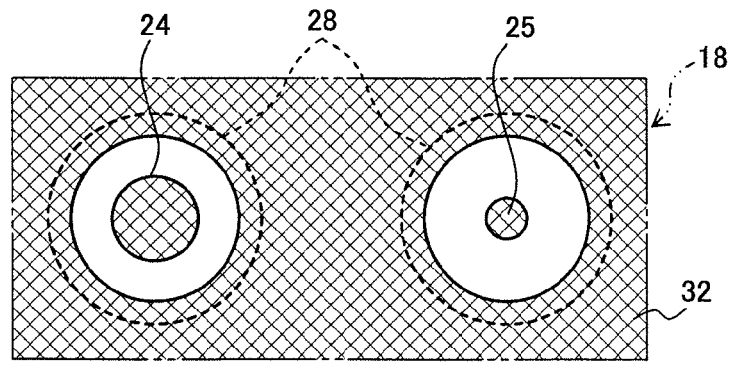
Figure 6D:
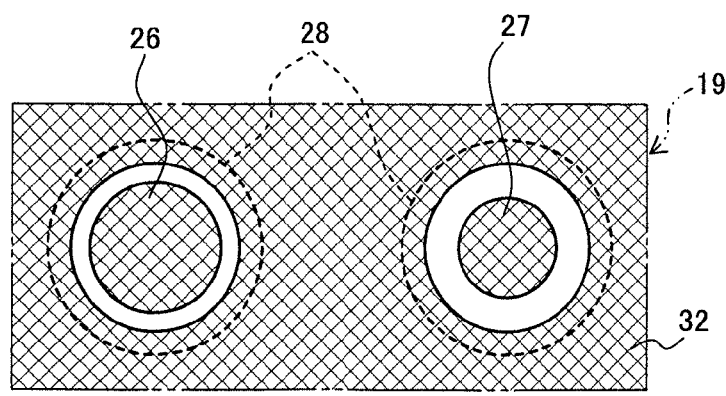

The photomask 3 is attachably and detachably held by the mask stage 2. As illustrated in FIG. 4, in the photomask 3, a first mask pattern group 16, a second mask pattern group 17, a third mask pattern group 18, and a fourth mask pattern group 19 are formed at a predetermined arrangement pitch. The first mask pattern group 16 is formed on one surface of a transparent substrate such as a quartz substrate, and has first light shielding patterns 20 (see, FIGS. 5A and 6A) arranged at an interval corresponding to two types of columnar spacer forming portions of different heights on the color filter substrate 8, in which the first light shielding patterns 20 each have a substantially same area as a cross sectional area of a columnar spacer. The second mask pattern group 17 has a second light shielding pattern 22 and an opening pattern 23 (see, FIGS. 5B and 6B) arranged at the interval corresponding to the two types of columnar spacer forming portions, in which the second light shielding pattern 22 corresponds to a higher columnar spacer forming portion of the two types of columnar spacer forming portions and has a predetermined area, and the opening pattern 23 corresponds to a lower columnar spacer forming portion. The third mask pattern group 18 has a third light shielding pattern 24 and a fourth light shielding pattern 25 (see, FIGS. 5C and 6C) arranged at the interval corresponding to the two types of columnar spacer forming portions, in which the third light shielding pattern 24 corresponds to the higher columnar spacer forming portion of the two types of columnar spacer forming portions and has a larger area than the second light shielding pattern 22, and the fourth light shielding pattern 25 corresponds to the lower columnar spacer forming portion and has a predetermined area. The fourth mask pattern group 19 has a fifth light shielding pattern 26 and a sixth light shielding pattern 27 (see, FIGS. 5D and 6D) arranged at the interval corresponding to the two types of columnar spacer forming portions, in which the fifth light shielding pattern 26 corresponds to the higher columnar spacer forming portion of the two types of columnar spacer forming portions and has a larger area than the third light shielding pattern 24, and the sixth light shielding pattern 27 corresponds to the lower columnar spacer forming portion and has a larger area than the fourth light shielding pattern 25.

In detail, in the first mask pattern group 16, three light shielding pattern line sets 21a, 21b, and 21c in each of which a plurality of first light shielding patterns 20 are arranged in the direction substantially orthogonal to the conveying direction (direction indicated by arrow A) of the color filter substrate 8 are arranged in parallel with each other at an arrangement pitch W (for example, W=2w). In the second mask pattern group 17, one light shielding pattern line set 21d in which a plurality of second light shielding patterns 22 and a plurality of opening patterns 23 are arranged in the direction substantially orthogonal to the direction indicated by arrow A is provided. In the third mask pattern group 18, one light shielding pattern line set 21e in which a plurality of third light shielding patterns 24 and a plurality of fourth light shielding patterns 25 are arranged in the direction substantially orthogonal to the direction indicated by arrow A is provided. In the fourth mask pattern group 19, one light shielding pattern line set 21f in which a plurality of fifth light shielding patterns 26 and a plurality of sixth light shielding patterns 27 are arranged in the direction substantially orthogonal to the direction indicated by arrow A is provided. The second mask pattern group 17 is located at a distance nW (n is a positive integer) from any of the light shielding pattern line sets 21a to 21c (the light shielding pattern line set 21a in FIG. 4) in the first mask pattern group 16. The second mask pattern group 17 to the fourth mask pattern group 19 are located at a distance mW (m is a positive integer smaller than n) from each other. Note that the second light shielding pattern 24 to the sixth light shielding pattern 27 are illustrated as open circles in FIG. 4 for the sake of simplicity.

In this embodiment, the photomask 3 has the following structure. The first mask pattern group 16 is formed on one surface of the quartz substrate, and the second mask pattern group 17 to the fourth mask pattern group 19 are formed on the other surface of the quartz substrate. In addition, microlenses 28 corresponding to the second light shielding pattern 22 to the sixth light shielding pattern 27 and the opening pattern 23 in the second mask pattern group 17 to the fourth mask pattern group 19, are formed on the same side as one surface of the quartz substrate, at a position retracting by a distance D from the surface on which the first mask pattern group 16 is formed toward the other surface of the quartz substrate (see, FIG. 4B).

As illustrated in FIG. 4B, such a photomask 3 can be formed as follows. The first mask pattern group 16 is formed on a chromium (Cr) light shielding film 32 provided on one surface 29a of a first quartz substrate 29. The second mask pattern group 17 to the fourth mask pattern group 19 are formed on the chromium (Cr) light shielding film 32 provided on one surface 30a of a second quartz substrate 30, and the microlenses 28 are formed on the other surface 30b of the second quartz substrate 30. The other surface 29b of the first quartz substrate 29 and the other surface 30b of the second quartz substrate 30 are butted and joined together by a transparent adhesive.

Alternatively, the photomask 3 may be formed in the following manner. The first mask pattern group 16 is formed on one surface of a quartz substrate. The second mask pattern group 17 to the fourth mask pattern group 19 are formed on one surface of another quartz substrate having a smaller thickness than the quartz substrate, and the microlenses 28 are formed on the other surface of the other quartz substrate. End surfaces of the two quartz substrates are then butted and joined together.

In these cases, it is preferable that a periphery of each microlens 28 is shielded from light by the chromium (Cr) light shielding film 32, as illustrated in FIGS. 4C and 5.

In addition, the photomask 3 has a rectangular opening on the side of the first mask pattern group 16 apart from the light shielding pattern line set 21a (hereafter, referred to as "first light shielding pattern line set") by a distance L, the first light shielding pattern line set is located on an upstream side in the conveying direction indicated by arrow A among the three light shielding pattern line sets 21a to 21c of the first mask pattern group 16. The opening has a longitudinal center axis parallel to a longitudinal center axis of the first light shielding pattern line set 21a. The opening serves as the observation window 33 that allows the below-mentioned imaging device 5 to observe the surface of the color filter substrate 8. In the observation window 33, an N-shaped slit (hereafter, referred to as "N slit") not illustrated is formed on the longitudinal center axis of the observation window 33. The N slit is used for detection of an edge of a pixel 9 of the color filter substrate 8 substantially orthogonal to the conveying direction (direction indicated by arrow A), and for alignment between the photomask 3 and the color filter substrate 8. Two parallel left and right slits of the N slit are orthogonal to the longitudinal center axis of the observation window 33, and the center of the N slit coincides with the longitudinal center axis of the observation window 33. Note that, other than the N slit, an alignment mark may be provided.

As illustrated in FIG. 1, the photomask 3 is positioned and fixed on the mask stage 2 so that the surface on which the first mask pattern group 16 and the microlenses 28 are formed faces the conveying device 1, and the observation window 33 is located on the upstream side in the conveying direction (direction indicated by arrow A) of the color filter substrate 8.

The exposure optical system 4 is formed above the mask stage 2. The exposure optical system 4 irradiates the photomask 3 with uniform source light L1, and includes a light source 34, a rod lens 35, and a condensing lens 36.

The light source 34 emits, for example, ultraviolet light of 355 nm in wavelength. The light source 34 is, for example, a flash lamp, an ultraviolet emitting laser light source whose light emission is controlled by the below-mentioned control device 7. The rod lens 35 is disposed forward in an emission direction of the source light L1 emitted from the light source 34, and makes a luminance distribution within a cross-section orthogonal to an optical axis of the source light L1 uniform. Note that an optical component for making the luminance distribution of the source light L1 uniform is not limited to the rod lens 35, and a light pipe or other known optical component may be used. The condenser lens 36 is disposed so that its anterior focal point coincides with an output end surface 35a of the rod lens 35, and converts the source light L1 emitted from the rod lens 35 into parallel light to irradiate the photomask 3 with the light.

The imaging device 5 is provided on the upstream side of the exposure optical system 4 in the conveying direction of the color filter substrate 8 indicated by arrow A. The imaging device 5 images a reference position of a pixel 9 as a positioning reference formed on the color filter substrate 8 and the N slit (not illustrated) formed in the observation window 33 of the photomask 3, at a position on the upstream side of an exposure position of the photomask 3 in the conveying direction. The imaging device 5 is a line camera in which a plurality of light receiving elements are arranged in a line in a direction substantially orthogonal to the conveying direction (direction indicated by arrow A) of the color filter substrate 8, within a plane parallel to the upper surface of the stage 15. A longitudinal center axis of the imaging device 5 substantially coincides with the longitudinal center axis of the observation window 33 of the photomask 3. Moreover, the imaging device 5 includes an optical path length correction device on its optical path so that the pixel 9 on the color filter substrate 8 and the N slit of the photomask 3 can be imaged simultaneously. Note that reference numeral 37 in FIG. 1 denotes a total reflection mirror that bends the optical path of the imaging device 5.

The illumination device 6 is provided under the stage 15 of the conveying device 1 corresponding to an imaging region of the imaging device 5. The illumination device 6 irradiates the color filter substrate 8 from below with illumination light made of visible light from which ultraviolet light is filtered out, to allow the imaging device 5 to observe the pixel 9 formed on the surface of the color filter substrate 8. For example, the illumination device 6 is a halogen lamp or the like. Note that the illumination device 6 may be provided above the stage 15 as epi-illumination.

Figure 7:
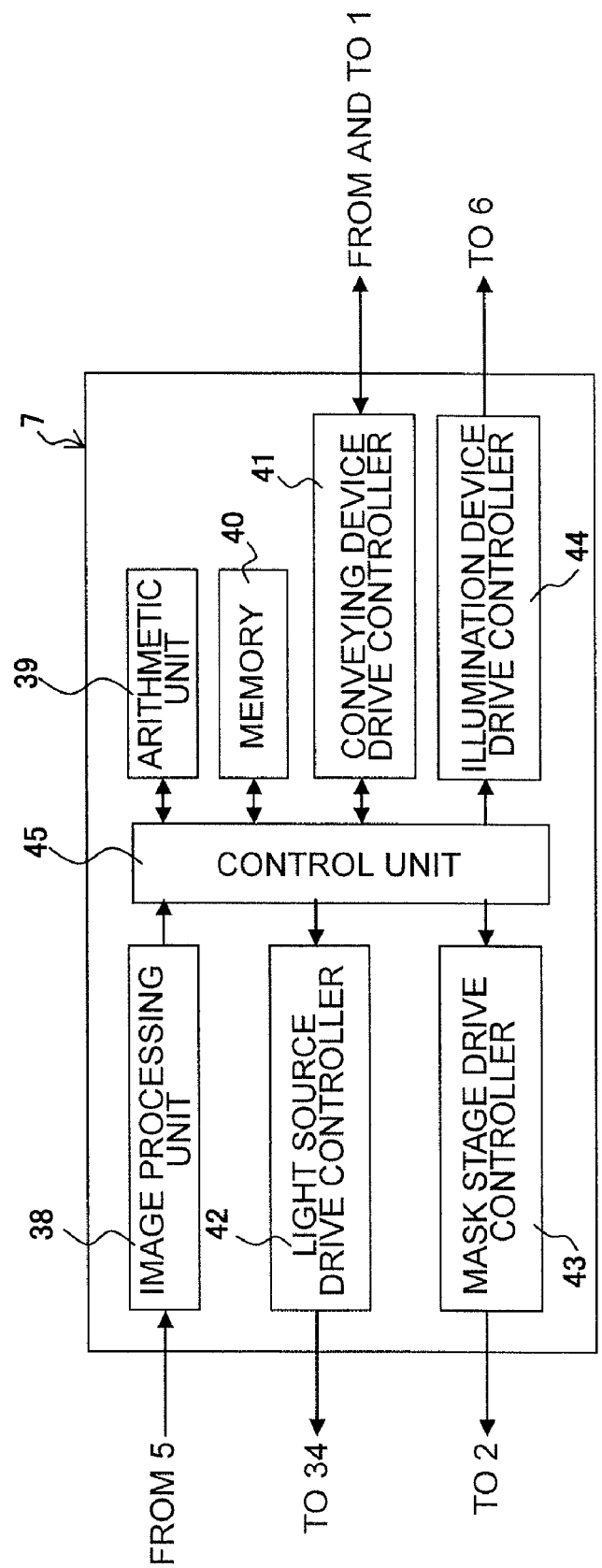
FIG. 7 is a block diagram illustrating a control device in the exposure apparatus.

The control device 7 is connected to the conveying device 1, the imaging device 5, the light source 34, the mask stage 2, and the illumination device 6. When the color filter substrate 8 passes under the photomask 3, the control device 7 controls an irradiation timing of exposure light L2 so that: outer regions of first light shielding portions 47 (see, FIG. 9) that are shielded from light by the first light shielding patterns 20 of the photomask 3 corresponding to two types of columnar spacer forming portions 46 on the substrate are repeatedly exposed a predetermined number of times; an outer region of a second light shielding portion 48 (see FIG. 10A) that has a predetermined area and is shielded from light by the second light shielding pattern 22 of the photomask 3 corresponding to a substantial center of a higher columnar spacer forming portion 46a of the two types of columnar spacer forming portions 46 of different heights and a lower columnar spacer forming portion 46b are exposed to a predetermined depth; an outer region of a third light shielding portion 49 that has a larger area than the second light shielding portion 48 and is shielded from light by the third light shielding pattern 24 of the photomask 3 corresponding to the substantial center of the higher columnar spacer forming portion 46a of the two types of columnar spacer forming portions 46 of different heights and an outer region of a fourth light shielding portion 50 (see, FIG. 10B) that has a predetermined area and is shielded from light by the fourth light shielding pattern 25 of the photomask 3 corresponding to a substantial center of the lower columnar spacer forming portion 46b are exposed; and an outer region of a fifth light shielding portion 51 that has a larger area than the third light shielding portion 49 and is shielded from light by the fifth light shielding pattern 26 of the photomask 3 corresponding to the substantial center of the higher columnar spacer forming portion 46a of the two types of columnar spacer forming portions 46 of different heights and an outer region of a sixth light shielding portion 52 (see FIG. 10C) that has a larger area than the fourth light shielding portion 50 and is shielded form light by the sixth light shielding pattern 27 of the photomask 3 corresponding to the substantial center of the lower columnar spacer forming portion 46b are exposed. As illustrated in FIG. 7, the control device 7 includes an image processing unit 38, an arithmetic unit 39, a memory 40, a conveying device drive controller 41, a light source drive controller 42, a mask stage drive controller 43, an illumination device drive controller 44, and a control unit 45.

The image processing unit 38 performs image processing on images of the surface of the color filter substrate 8 and the N slit of the photomask 3 captured by the imaging device 5, to detect a reference position preset for the pixel 9 on the color filter substrate 8 and a reference position preset for the N slit of the photomask 3.

The arithmetic unit 39 calculates a distance between the reference position on the color filter substrate 8 and the reference position of the photomask 3 detected by the image processing unit 38, compares the calculated distance with a target value stored in the below-mentioned memory 40, and outputs a difference between the two values to the mask stage drive controller 43 as a correction value. The arithmetic unit 39 also compares the number of times the edge of the pixel 9 of the color filter substrate 8 substantially orthogonal to the conveying direction (direction indicated by arrow A) which is detected using the N slit, with a target number of times stored in the memory 40. Each time these numbers match, the arithmetic unit 39 outputs a lighting command to turn on the light source 34, to the light source drive controller 42.

The memory 40 temporarily stores a calculation result of the arithmetic unit 39, and also stores a moving velocity V of the stage 15, the target value of the distance between the reference position on the color filter substrate 8 and the reference position of the photomask 3, and other initial setting values.

The conveying device drive controller 41 moves the stage 15 of the conveying device 1 in the direction indicated by arrow A at a constant velocity. The conveying device drive controller 41 receives an output signal of the velocity sensor in the conveying device 1, compares the output signal with the moving velocity V of the stage 15 stored in the memory 40, to thereby control the conveying device 1 so that the two values match.

The light source drive controller 42 intermittently turns on the light source 34, and transmits a drive signal to the light source 34 according to the lighting command received from the operation unit 39.

The mask stage drive controller 43 moves the mask stage 2 together with the imaging device 5, in the direction substantially orthogonal to the conveying direction indicated by arrow A. The mask stage drive controller 43 controls the movement of the mask stage 2 based on the correction value received from the arithmetic unit 39.

The illumination device drive controller 44 turns on and off the illumination device 6. The illumination device drive controller 44 controls to turn on the illumination device 6 when an exposure start switch is turned on, and turn off the illumination device 6 when all exposure for the color filter substrate 8 is completed. The control unit 45 controls to mediate between the above-mentioned components so that each component operates appropriately.

Figure 8:
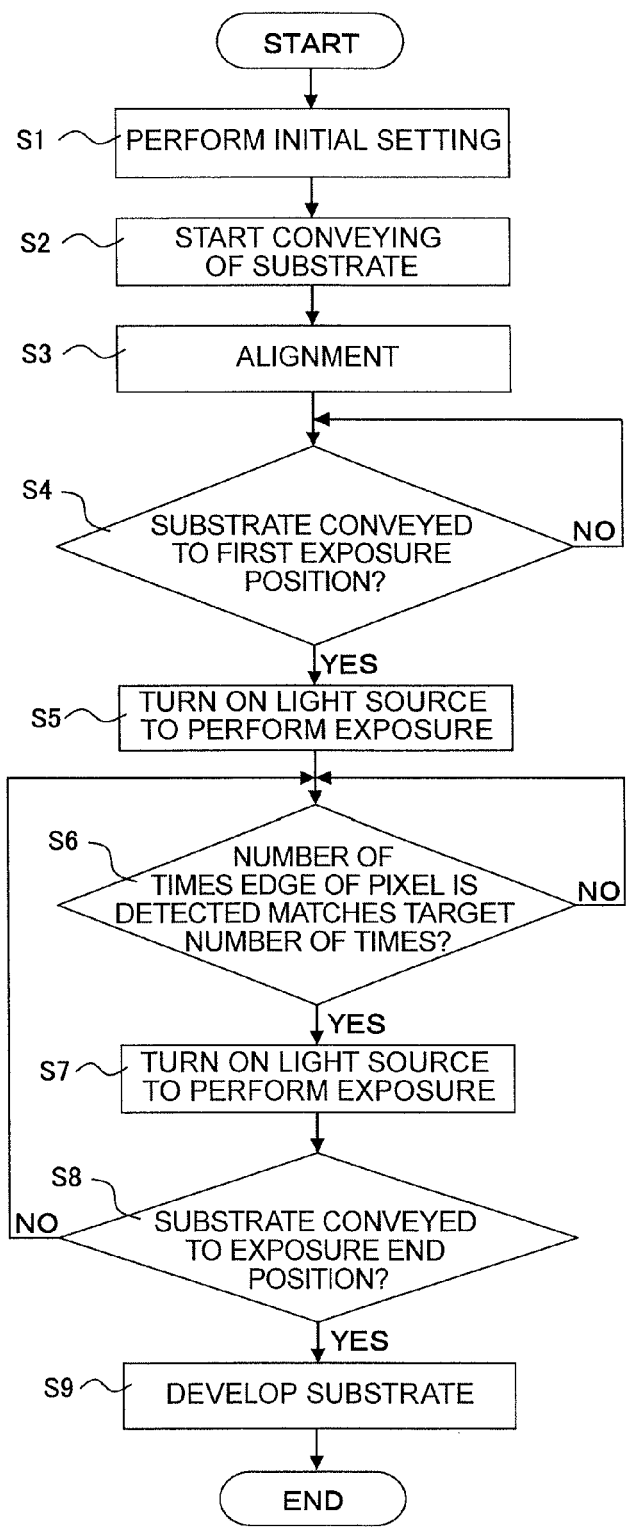
FIG. 8 is a flowchart illustrating a method for forming columnar spacer according to the present invention.

The following describes an operation of the exposure apparatus having the above-mentioned structure and a columnar spacer forming method that uses the exposure apparatus, with reference to a flowchart of FIG. 8.

First, in step S1, through an operation device (not illustrated) including, for example, a keyboard and the like, the moving velocity V of the stage 15, a moving distance of the stage 15 from when exposure is started to when exposure is completed, power and an illumination time period of the light source 34, the distance L between the first light shielding pattern line set 21a of the first mask pattern group 16 and the observation window 33 in the photomask 3, the target value of the number of times the edge of the pixel 9 of the color filter substrate 8 substantially orthogonal to the conveying direction (direction indicated by arrow A) is detected, the target value of the distance between the reference position of the color filter substrate 8 and the reference position of the photomask 3, and the like are input and stored in the memory 40, thereby performing initial settings.

Next, in step S2, the color filter substrate 8 of which surface is coated with the positive photosensitive material 13 is positioned and mounted on the stage 15 at the predetermined position, with the coated surface facing upward. When the exposure start switch (not illustrated) is turned on, the conveying device drive controller 41 in the control device 7 is activated to move the stage 15 in the direction of arrow A at the velocity V, thereby starting the conveying of the color filter substrate 8. Here, the conveying device drive controller 41 receives the output signal of the velocity sensor in the conveying device 1, compares the output signal with the velocity V stored in the memory 40, and controls the conveying device 1 so that the stage 15 moves at the velocity V. At the same time, the illumination device drive controller 44 is activated to turn on the illumination device 6, thereby starting the imaging of the surface of the color filter substrate 8 by the imaging device 5.

In step S3, the color filter substrate 8 and the photomask 3 are aligned. In detail, when the color filter substrate 8 is conveyed with the movement of the stage 15 and a pixel 9 located forward in the conveying direction (direction indicated by arrow A) among the pixels 9 formed on the color filter substrate 8 reaches the imaging region of the imaging device 5, the imaging device 5 simultaneously images the pixel 9 through the observation window 33 of the photomask 3 and the N slit in the observation window 33 of the photomask 3. The imaging device 5 outputs an electrical signal of the captured image to the image processing unit 38 in the control device 7.

The image processing unit 38 performs image processing on the electrical signal of the captured image received from the imaging device 5, detect the reference position of the color filter substrate 8 such as a position of a left edge of the pixel 9 parallel to the conveying direction, and the reference position of the N slit of the photomask 3 such as the center position of the left slit of the two slits parallel to the conveying direction. The image processing unit 38 outputs these position data to the arithmetic unit 39.

The arithmetic unit 39 calculates the distance between the reference position of the pixel 9 and the reference position of the N slit of the photomask 3 based on the position data received form the image processing unit 38, compares the calculated distance with the target value of the distance between the two positions read from the memory 40, and outputs a difference between the two values to the mask stage drive controller 43 as a correction value.

The mask stage drive controller 43 moves the mask stage 2 by the correction value received from the arithmetic unit 39 in a direction substantially orthogonal to the direction indicated by arrow A (conveying direction) within the plane parallel to the surface of the stage 15. The mask stage drive controller 43 thus aligns the color filter substrate 8 and the photomask 3. Note that the alignment is performed while the pixel 9 on the color filter substrate 8 is moving from the observation window 33 of the photomask 3 to the first light shielding pattern line set 21a of the first mask pattern group 16. The alignment is also performed during exposure at all times.

In step S4, it is determined whether or not the color filter substrate 8 is conveyed to such a point that a first pair of columnar spacer forming portions 46a and 46b (see, FIG. 2) corresponding to four corners of the pixel 9 located forward in the conveying direction (direction indicated by arrow A) among the pixels 9 formed on the color filter substrate 8 coincide with the first light shielding pattern line set 21a of the first mask pattern group 16 in the photomask 3. In this case, the moving distance of the color filter substrate 8 is detected as follows. First, the imaging device 5 captures the image of the pixel 9 on the color filter substrate 8, through the N slit in the observation window 33. The image processing unit 38 processes the captured image, to detect the edge of the pixel 9 substantially orthogonal to the conveying direction (direction indicated by arrow A). Following this, the arithmetic unit 39 calculates a length of each of left and right parts of the edge of the pixel 9 situated between the left and right parallel slits of the N slit, as divided by a center line of an inclined slit of the N slit. The position of the color filter substrate 8 when the color filter substrate 8 is conveyed to such a point that the left and right parts of the divided edge are equal in length is used as a reference position to detect the moving distance of the color filter substrate 8 by the position sensor in the conveying device 1. The arithmetic unit 39 compares the detected moving distance of the color filter substrate 8, with the target value of the moving distance calculated based on the distance L between the first light shielding pattern line set 21a and the observation window 33 read out from the memory 40 and a width of the pixel 9 in the substrate conveying direction. When the detected moving distance matches the target value and the determination results in "YES" in step S4, the process proceeds to step S5.

In step S5, the arithmetic unit 39 outputs the lighting command to turn on the light source 34, to the light source drive controller 42. The light source drive controller 42 outputs the drive signal to the light source 34, according to the lighting command. As a result, the light source 34 is turned on for the predetermined time at the predetermined power, according to the above-mentioned initial settings.

Figure 9A:
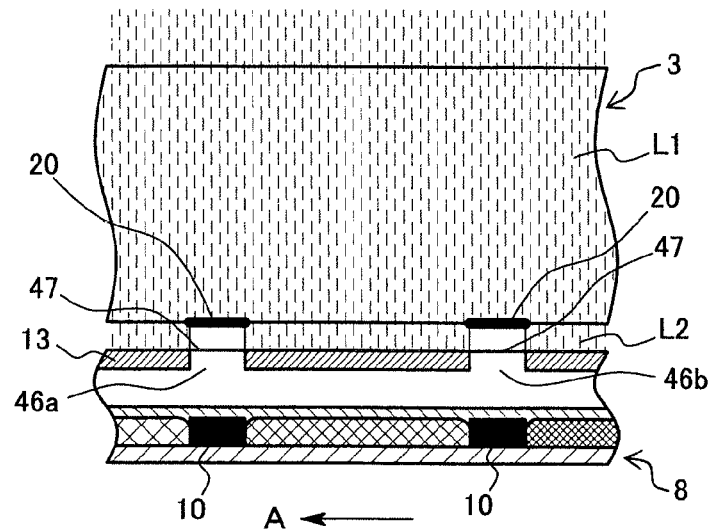
FIGS. 9A to 9C are explanatory views illustrating exposure repeatedly performed for outer regions of columnar spacer forming portions using the first mask pattern group.

The ultraviolet source light L1 emitted from the light source 34 is made uniform in luminance distribution by the rod lens 35, and then converted to parallel light by the condenser lens 36. The photomask 3 is irradiated with this light. The photosensitive material 13 on the color filter substrate 8 is exposed to the exposure light L2 passing through the photomask 3. Here, as illustrated in FIG. 9A, the outer regions of the first light shielding portions 47 that correspond to the pair of columnar spacer forming portions 46a and 46b located forward in the conveying direction of the color filter substrate 8 and are shielded from light by the first light shielding patterns 20 of the first light shielding pattern line set 21a in the first mask pattern group 16 are exposed a first time, as a result of which the photosensitive material 13 is exposed to a predetermined depth. The following mainly describes exposure performed on the pair of columnar spacer forming portions 46 located forward in the conveying direction.

In step S6, the edge of the pixel 9 orthogonal to the conveying direction (direction indicated by arrow A) is detected through the N slit, in the same way as in step S4. The arithmetic unit 39 counts the number of times the edges of a plurality of pixels 9 coincide with the center line of the N slit (or the longitudinal center axis line of the observation window 33) when the color filter substrate 8 is conveyed. The arithmetic unit 39 compares the counted number of times with the target number of times ("2" in this embodiment) read out from the memory 40, and determines whether or not the two numbers match. When the two numbers match and the determination results in "YES", the process proceeds to step S7.

Figure 9B:
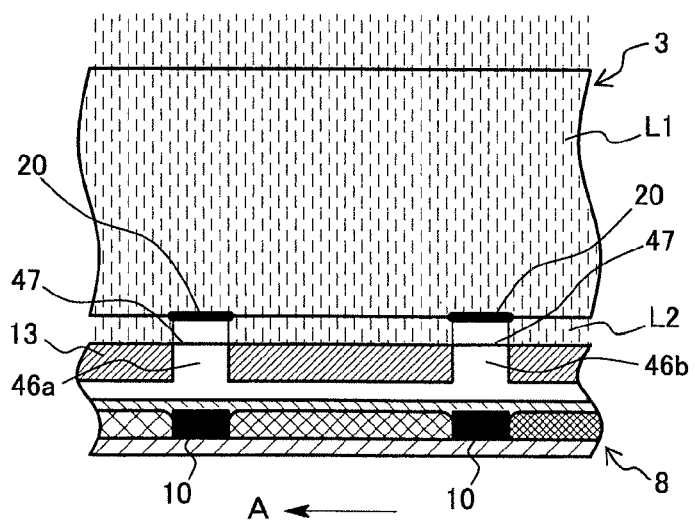

In step S7, the arithmetic unit 39 outputs the lighting command to turn on the light source 34, to the light source drive controller 42. The light source drive controller 42 outputs the drive signal to the light source 34, according to the lighting command. As a result, the light source 34 is turned on for the predetermined time at the predetermined power according to the initial settings, and the photosensitive material 13 on the color filter substrate 8 is exposed. At this time, as illustrated in FIG. 9B, the outer regions of the first light shielding portions 47 that correspond to the pair of columnar spacer forming portions 46*a* and 46*b* located forward in the conveying direction and are shielded from light by the first light shielding patterns 20 of the second light shielding pattern line set 21*b* in the first mask pattern group 16 are further exposed a second time, as a result of which the photosensitive material 13 is exposed deeper.

In step S8, the arithmetic unit 39 compares the moving distance of the color filter substrate 8 detected by the position sensor in the conveying device 1, with the moving distance of the color filter substrate 8 to the exposure end position read out from the memory 40. The arithmetic unit 39 determines whether or not the two distances match. When the two distances do not match and the determination results in "NO", the process returns to step S6. Steps S6 to S8 are repeated until the determination of step S8 results in "YES". Each time the number of times the edge of the pixel 9 on the color filter substrate 8 is detected matches the target number of times, the light source 34 is turned on for the predetermined time to perform exposure.

Figure 9C:
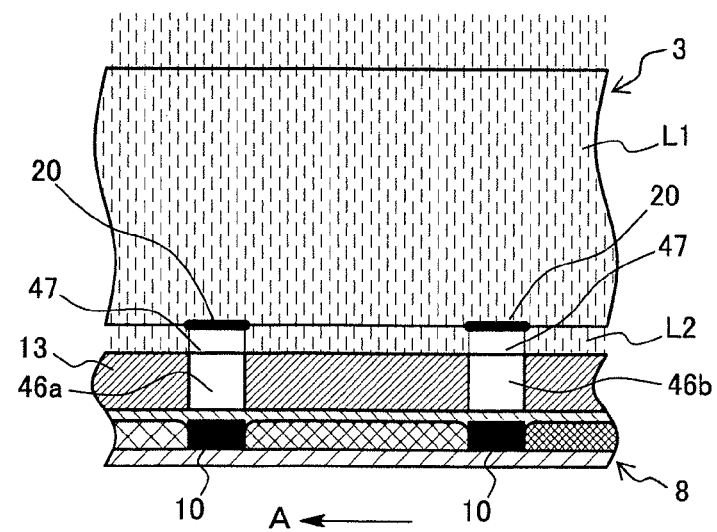

Thus, as illustrated in FIG. 9C, the outer regions of the first light shielding portions 47 that correspond to the pair of columnar spacer forming portions 46*a* and 46*b* located forward in the conveying direction and are shielded from light by the first light shielding patterns 20 of the third light shielding pattern line set 21*c* in the first mask pattern group 16 are further exposed a third time, as a result of which the photosensitive material 13 is exposed over the whole thickness.

Figure 10A:
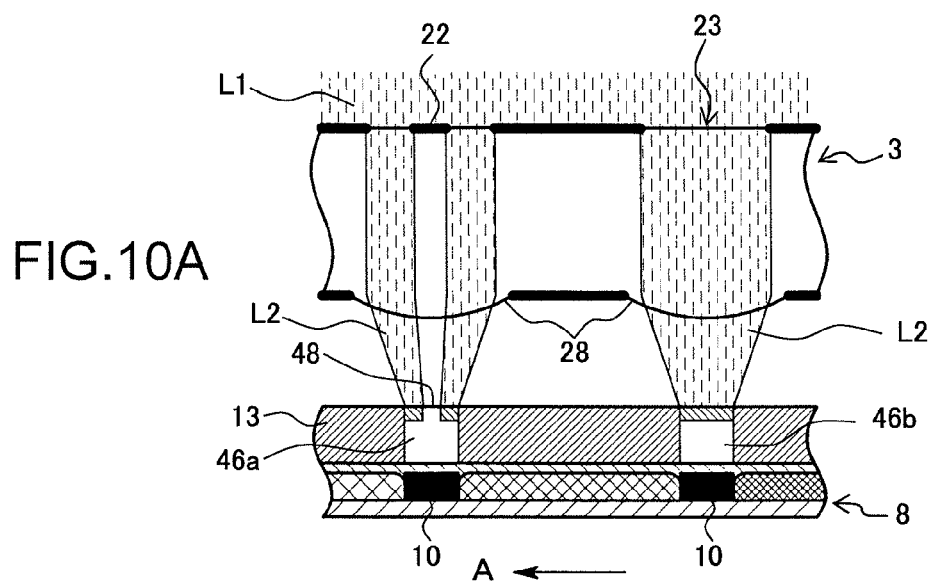
FIGS. 10A to 10C are explanatory views illustrating stepwise exposure repeatedly performed for the columnar spacer forming portions using the second to fourth mask pattern groups.

After this, when the color filter substrate 8 is conveyed and the pair of columnar spacer forming portions 46*a* and 46*b* located forward in the conveying direction reach under the second mask pattern group 17 of the photomask 3, as illustrated in FIG. 10A, the outer region of the second light shielding portion 48 shielded from light by the second light shielding pattern 22 of the second mask pattern group 17 of the photomask 3 at the substantial center of the higher columnar spacer forming portion 46*a* of the pair of columnar spacer forming portions 46*a* and 46*b* and the region corresponding to the opening pattern 23 of the second mask pattern group 17 of the photomask 3 in the lower columnar spacer forming portion 46*b* are exposed to a predetermined depth.

Figure 10B:
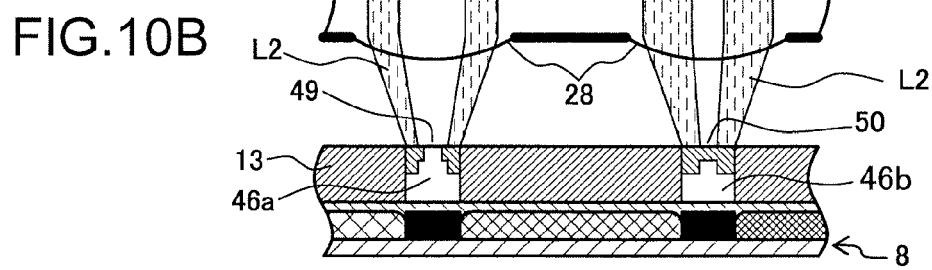

When the color filter substrate 8 is further moved and the pair of columnar spacer forming portions 46*a* and 46*b* located front in the conveying direction reach under the third mask pattern group 18 of the photomask 3, as illustrated in FIG. 10B, the outer region of the third light shielding portion 49 that has a larger area than the second light shielding portion 48 and is shielded from light by the third light shielding pattern 24 of the third mask pattern group 18 of the photomask 3 at the substantial center of the higher columnar spacer forming portion 46*a* of the pair of columnar spacer forming portions 46*a* and 46*b* and the outer region of the fourth light shielding portion 50 with a predetermined area shielded from light by the fourth light shielding pattern 25 of the third mask pattern group 18 at the substantial center of the lower columnar spacer forming portion 46*b* are exposed.

Figure 10C:
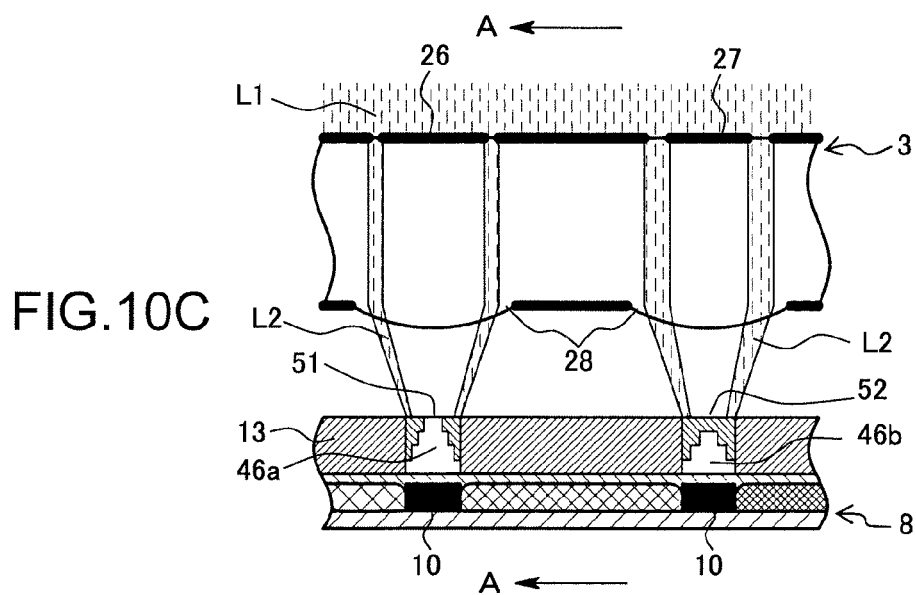

When the color filter substrate 8 is further moved and the pair of columnar spacer forming portions 46*a* and 46*b* located forward in the conveying direction reach under the fourth mask pattern group 19 of the photomask 3, as illustrated in FIG. 10C, the outer region of the fifth light shielding portion 51 that has a larger area than the third light shielding portion 49 and is shielded from light by the fifth light shielding pattern 26 of the fourth mask pattern group 19 of the photomask 3 at the substantial center of the higher columnar spacer forming portion 46*a* of the pair of columnar spacer forming portions 46*a* and 46*b* and the outer region of the sixth light shielding portion 52 that has a larger area than the fourth light shielding portion 50 and is shielded from light by the sixth light shielding pattern 27 of the fourth mask pattern group 19 at the substantial center of the lower columnar spacer forming portion 46*b* are exposed.

Furthermore, a plurality of pairs of columnar spacer forming portions 46 following the pair of columnar spacer forming portions 46 located forward in the conveying direction are sequentially exposed by executing steps S6 to S8. Thus, exposure is performed each time the number of times the edge of the pixel 9 on the color filter substrate 8 is detected matches the target number of times. When the color filter substrate 8 reaches the exposure end position and the determination of step S8 results in "YES", the process proceeds to step S9.

Figure 11:
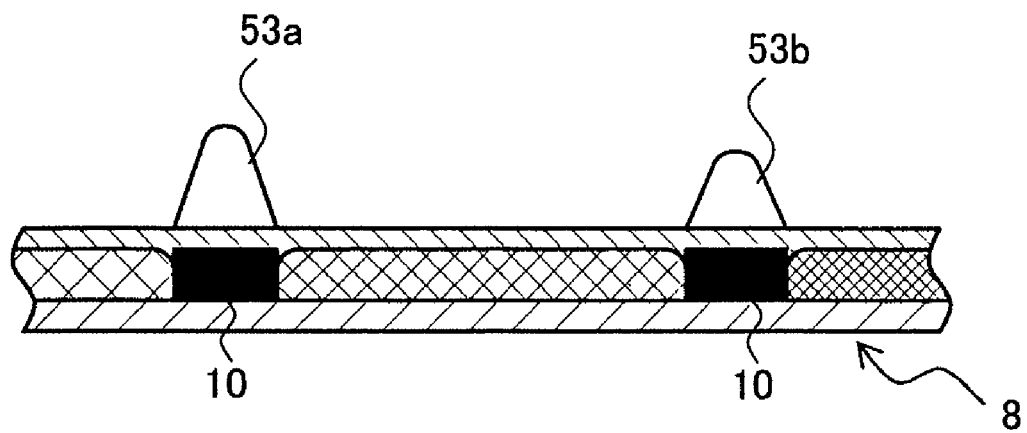
FIG. 11 is a main part enlarged sectional view illustrating columnar spacers of different heights formed by the method for forming columnar spacer according to the present invention.

In step S9, the photosensitive material 13 on the color filter substrate 8 is developed by a predetermined developer. In this way, the photosensitive material 13 exposed to the exposure light L2 is eluted to the developer, while the unexposed photosensitive material 13 corresponding to the columnar spacer forming portions 46 remains. Thus, as illustrated in FIG. 11, two types of columnar spacers 53*a* and 53*b* that have substantially hemispherical top parts and differ in height from each other are formed.

The above-mentioned embodiment describes the case in which the peripheral regions of the columnar spacer forming portions 46 are repeatedly exposed three times using the first mask pattern group 16 and the columnar spacer forming portions 46 are repeatedly exposed three times in a stepwise manner using the second mask pattern group 17 to the fourth mask pattern group 19, however, the present invention is not limited to this. The number of stepwise exposures of the columnar spacer forming portions 46 which is repeatedly performed is appropriately determined based on a balance between irradiation energy of exposure light collected by the microlenses 28 and irradiation energy of exposure light irradiated through the first mask pattern group 16.

The above-mentioned embodiment describes the case in which the stepwise exposure of the columnar spacer forming portions 46 is repeatedly performed through the microlenses 28, however, the present invention is not limited to this, and the microlenses 28 may be omitted. In this case, the first mask pattern group 16 to the fourth mask pattern group 19 are all provided on the same surface of the photomask 3, and positioned so as to face the color filter substrate 8 in proximity.

The above-mentioned embodiment describes the case in which the two types of convex patterns of different heights are formed, however, the present invention is not limited to this, and can be applied to the forming of three or more types of convex patterns of different heights. In this case, at least the following may be performed. After the outer regions of the first light shielding portions that are shielded from light by the photomask corresponding to a plurality of types of convex pattern forming portions on the substrate are repeatedly exposed a predetermined number of times, the outer region of the second light shielding portion that has a predetermined area and is shielded from light by the photomask corresponding to a substantial center of a predetermined convex pattern forming portion (the highest convex pattern forming portion) of the plurality of types of convex pattern forming portions, and a convex pattern forming portion other than the predetermined convex pattern forming portion, are exposed to a predetermined depth.

In the above description, the case in which the substrate is the color filter substrate 8 is described, however, the present invention is not limited to this, and can be applied to any substrate on which a plurality of types of convex patterns of different heights are formed.

It should be appreciated that the entire contents of Japanese Patent Application No. 2008-319722, filed on Dec. 16, 2008, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. A method for forming convex patterns in which a substrate coated with a positive photosensitive material is irradiated with exposure light through a photomask to expose the photosensitive material, thereby forming a plurality of types of convex patterns of different heights on the substrate, the method comprising the following steps to be executed while conveying the substrate coated with a positive photosensitive material under the photomask in one direction at a constant velocity:
   repeatedly exposing outer regions of first light shielding portions on convex patterns forming portions that are sequentially shielded from light by a plurality of first shielding patterns arranged in the conveying direction of the substrate among the plurality of first shielding patterns formed on the photomask corresponding to a plurality of types of convex pattern forming portions for the plurality of types of convex patterns on the substrate by a predetermined number of times;
   exposing an outer region of a second light shielding portion on a predetermined convex pattern that has a predetermined area and is shielded from light by a second shielding pattern formed on the photomask corresponding to a substantial center of a predetermined convex pattern forming portion among the plurality of types of convex pattern forming portions to a predetermined depth, and exposing a convex pattern forming portion other than the predetermined convex pattern forming portion that is irradiated with exposure light through an opening pattern formed on the photomask corresponding to the convex pattern forming portion other than the predetermined convex pattern forming portion to a predetermined depth; and
   developing the photosensitive material on the substrate.

2. An exposure apparatus for forming a plurality of types of convex patterns of different heights on a substrate coated with a positive photosensitive material, comprising:
   a conveying device that conveys the substrate coated with the positive photosensitive material in one direction at a constant velocity; and
   a control device that exposes the photosensitive material by controlling an irradiation timing of exposure light with which the substrate is irradiated through a photomask, wherein
   when the substrate passes under the photomask, the control device controls the irradiation timing of the exposure light at least so that:
   outer regions of first light shielding portions on convex patterns forming portions that are sequentially shielded from light by a plurality of first shielding patterns arranged in the conveying direction of the substrate among the plurality of first shielding patterns formed on the photomask corresponding to a plurality of types of convex pattern forming portions for the plurality of types of convex patterns on the substrate are repeatedly exposed a predetermined number of times; and
   an outer region of a second light shielding portion on a predetermined convex pattern that has a predetermined area and is shielded from light by a second shielding pattern formed on the photomask corresponding to a substantial center of a predetermined convex pattern forming portion among the plurality of types of convex pattern forming portions are exposed to a predetermined depth, and a convex pattern forming portion other than the predetermined convex pattern forming portion that is irradiated with exposure light through an opening pattern formed on the photomask corresponding to the convex pattern forming portion other than the predetermined convex pattern forming portion are exposed to a predetermined depth.

3. A photomask for forming a plurality of types of convex patterns of different heights on a substrate coated with a positive photosensitive material, used in an exposure apparatus that, while conveying the substrate coated with the positive photosensitive material in one direction at a constant velocity, exposes the photosensitive material by controlling an irradiation timing of exposure light with which the substrate is irradiated, the photomask comprising:
   a transparent substrate;
   a first mask pattern group; and
   a second mask pattern group,
   wherein the first mask pattern group has first light shielding patterns arranged at an interval corresponding to a plurality of types of convex pattern forming portions for the plurality of types of convex patterns on the substrate, each of the first light shielding patterns having a substantially same area as a cross sectional area of a convex pattern, and
   wherein the second mask pattern group has a second light shielding pattern and an opening pattern arranged at the interval corresponding to the plurality of types of convex pattern forming portions, the second light shielding pattern having a predetermined area and corresponding to a predetermined convex pattern forming portion among the plurality of types of convex pattern forming portions, and the opening pattern corresponding to a convex pattern forming portion other than the predetermined convex pattern forming portion.

4. The photomask according to claim 3, wherein the first mask pattern group is formed on one surface of the transparent substrate, the second mask pattern group is formed on the other surface of the transparent substrate, and microlenses are formed on the same side as the surface of the transparent substrate at a position retracting by a predetermined distance, from the surface on which the first mask pattern group is formed toward the other surface of the transparent substrate, the microlenses corresponding to the second light shielding pattern and the opening pattern of the second mask pattern group.

5. The photomask according to claim 4, wherein the first mask pattern group is formed on one surface of a first transparent substrate, the second mask pattern group is formed on one surface of a second transparent substrate and the microlenses are formed on the other surface thereof, and the other surface of the first transparent substrate and the other surface of the second transparent substrate are butt-joined together.

6. The photomask according to claim 4, wherein the first mask pattern group is formed on one surface of a first transparent substrate, the second mask pattern group is formed on one surface of a second transparent substrate having a smaller thickness than the first transparent substrate and the microlenses are formed on the other surface of the second transparent substrate, and an end surface of the first transparent substrate and an end surface of the second transparent substrate are butt-joined together.

7. The photomask according to claim 4, wherein peripheries of the microlenses are shielded from light by a light shielding film.

* * * * *